(12) United States Patent
Sasaki

(10) Patent No.: US 7,230,434 B1
(45) Date of Patent: Jun. 12, 2007

(54) MULTI-LAYERED CAPACITOR

(75) Inventor: Seiichiro Sasaki, Saitama (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/442,417

(22) Filed: May 30, 2006

(51) Int. Cl.
*G01R 31/12* (2006.01)
*H01L 29/00* (2006.01)

(52) U.S. Cl. ...................... 324/548; 257/532
(58) Field of Classification Search ............. 324/548, 324/658
See application file for complete search history.

(56) References Cited

U.S. PATENT DOCUMENTS 6,395,590 B1 * 5/2002 Leu ........................ 438/186
6,967,118 B2 * 11/2005 Weng et al. ............... 438/29
2005/0145987 A1 7/2005 Okuda et al.
2006/0113578 A1 * 6/2006 Chung et al. ............. 257/303

FOREIGN PATENT DOCUMENTS

| JP | 2001-177056 | 6/2001 |
| JP | 2005-108874 | 4/2005 |

* cited by examiner

*Primary Examiner*—Vincent Q. Nguyen
(74) *Attorney, Agent, or Firm*—Nixon Peabody LLP; Donald R. Studebaker

(57) ABSTRACT

According to the present invention, a multi-layered capacitor includes a first capacitive element having a first conductor plate formed on a first layer, a second conductor plate formed on a second layer and an insulator arranged between the first and second conductor plates; and a second capacitive element which is arranged just on a layer above or below the first capacitive element.

9 Claims, 6 Drawing Sheets

MULTI-LAYERED CAPACITOR

TECHNICAL FIELD OF THE INVENTION

The present invention relates to a multi-layered capacitor structure, in particular to a multi-layered capacitor including a pair of flat conductor plates and an insulating layer arranged between the pair of conductor plates.

BACKGROUND OF THE INVENTION

A conventional MIM (Metal-Insulator-Metal) capacitor includes a top conductor plate, a bottom conductor plate and an insulator, arranged between the top and bottom conductor plates. According to such a MIM capacitor, a lower resistance and a higher density of capacitance can be provided.

However, according to a design rule, it could be prohibited that an active device or a passive device is arranged in above or below layer of the capacitor. In other words, the above and below layers of the capacitor are not used efficiently. As a result, the more capacitance is provided, the more dead space is made in a semiconductor chip.

OBJECTS OF THE INVENTION

Accordingly, an object of the present invention is to provide a multi-layered capacitor which can use a space and an area in a semiconductor chip efficiently. In other words, an object of the present invention is to provide a multi-layered capacitor which can be designed small in size, which improves integration of a semiconductor chip.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to the present invention, a multi-layered capacitor includes a first capacitive element having a first conductor plate formed on a first layer, a second conductor plate formed on a second layer and an insulator arranged between the first and second conductor plates; and a second capacitive element which is arranged just on a layer above or below the first capacitive element.

The first capacitive element may be of a MIM (Metal-Insulator-Metal) type. The second capacitive element may be of a MOM (Metal-Oxide-Metal) type, comprising first and second conductor regions formed on the same layer. The second capacitive element also may be of a POP (Poly-Oxide-Poly) type, comprising a pair of poly-silicon regions and an silicon oxide region formed between the pair of poly-silicon regions. Further, the second capacitive element may be of a MOS-CAP structure.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
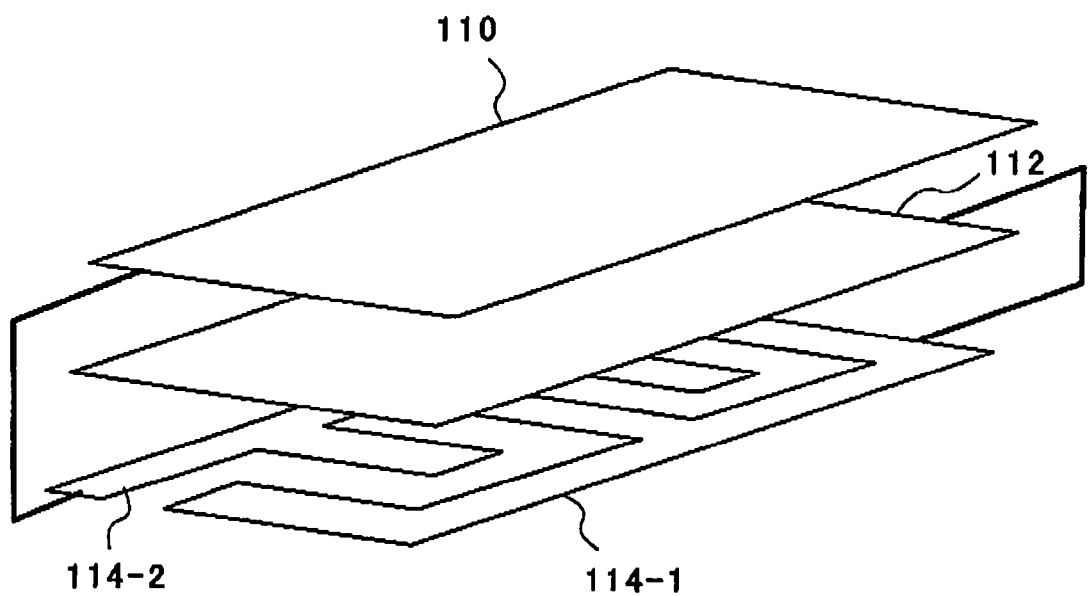
FIG. 1 is a schematic diagram illustrating a multi-layered capacitor according to a first preferred embodiment of the present invention.

FIG. 1 is a schematic diagram illustrating a multi-layered capacitor according to a first preferred embodiment of the present invention. The capacitor includes a first capacitive element (110 & 112) having a first conductor plate 110 formed on a first layer, a second conductor plate 112 formed on a second layer and an insulator arranged between the first and second conductor plates 110 and 112. The capacitor also includes a second capacitive element (114-1 & 114-2) which is arranged just below the second conductor plate 112.

The first capacitive element (110 & 112) is of a MIM (Metal-Insulator-Metal) type. In other words, the first conductor plate 110 and second conductor plate 112 are made of metal.

The second capacitive element (114-1 & 114-2) is of a MOM (Metal-Oxide-Metal) type, including first and second conductor regions 114-1 and 114-2 formed on the same layer, which is just below the second conductor plate 112 of the first capacitive element. The second capacitive element (114-1 & 114-2) can be formed on a layer just above the first conductor plate 110 of the first capacitive element. The conductor regions 114-1 and 114-2 are made of metal and are insulated by an oxide region.

The first conductor plate 110 of the first capacitive element and the second conductor region 114-2 of the second capacitive element are electrically connected to each other, while the second conductor plate 112 of the first capacitive element and the first conductor region 114-1 of the second capacitive element are electrically connected to each other.

Figure 2:
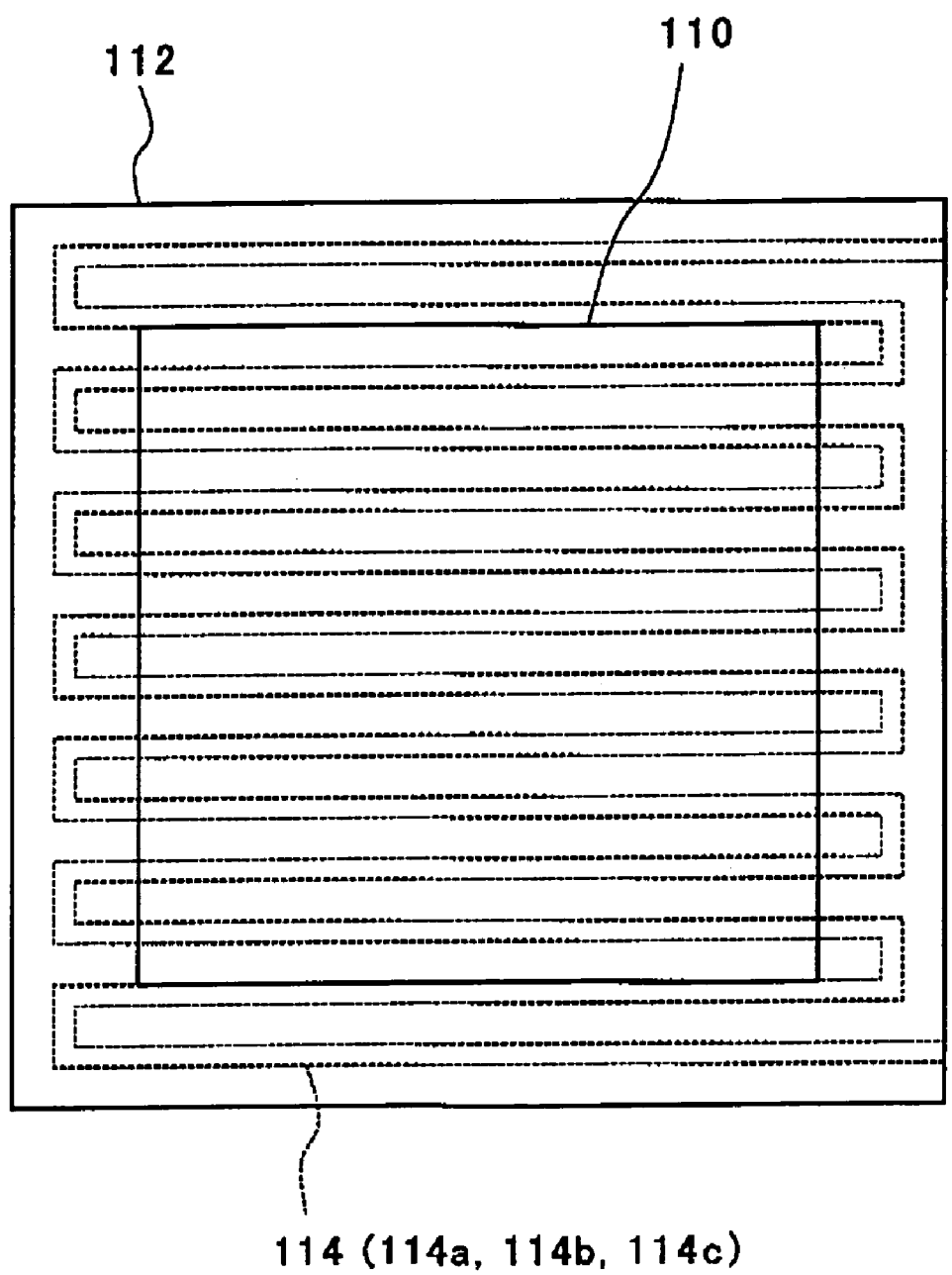
FIG. 2 is a top view illustrating a multi-layered capacitor according to the first preferred embodiment of the present invention.
Figure 3:
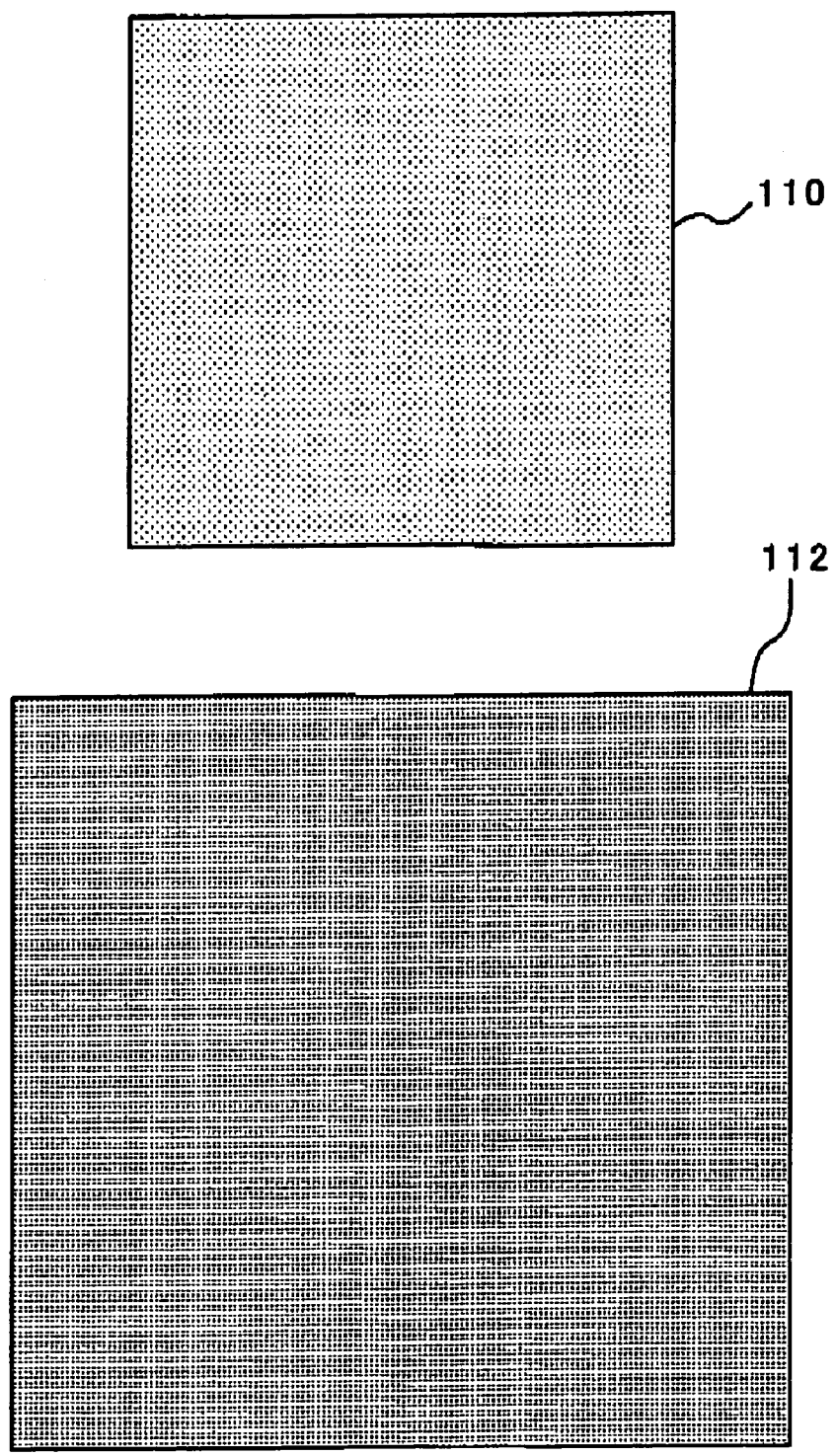
FIG. 3 includes plane views illustrating a top conductor plate and a bottom conductor plate used in the multi-layered capacitor according to the first preferred embodiment of the present invention.
Figure 4:
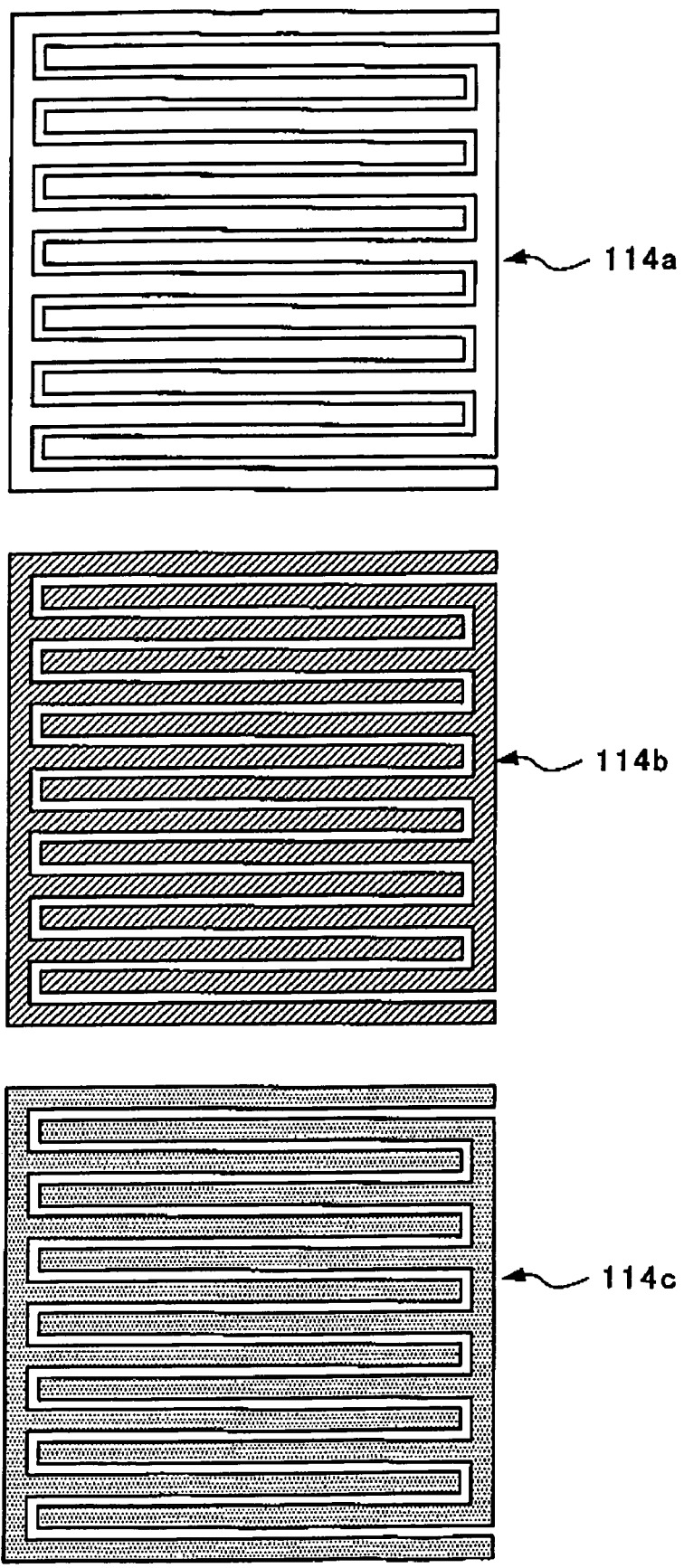
FIG. 4 includes plane views illustrating a second capacitive element used in the multi-layered capacitor according to the first preferred embodiment of the present invention.

FIG. 2 is a top view illustrating the detail of the multi-layered capacitor shown in FIG. 1. FIG. 3 includes plane views illustrating the first conductor plate 110 and the second conductor plate 112 used in the multi-layered capacitor shown in FIGS. 1 and 2. FIG. 4 includes plane views illustrating the second capacitive elements 114a, 114b and 114c used in the multi-layered capacitor shown in FIGS. 1 and 2. The second capacitive element 114 may include three MOM capacitors 114a, 114b and 114c, as shown in FIG. 4. The second capacitive element 114 may include two or more of MOM capacitors.

The three of MOM capacitors 114a, 114b and 114c are layered in order just below or above the first capacitive element (110 & 112). The second capacitive element may be of a POP (Poly-Oxide-Poly) type, including a pair of poly-silicon regions and a silicon oxide region formed between the pair of poly-silicon regions. The second capacitive element also may be of a MOS-CAP structure.

As described above, according to the first preferred embodiment of the present invention, a multi-layered capacitor can use a space and an area in a semiconductor chip efficiently. In other words, a multi-layered capacitor can be designed small in size, which improves integration of a semiconductor chip.

Figure 5:
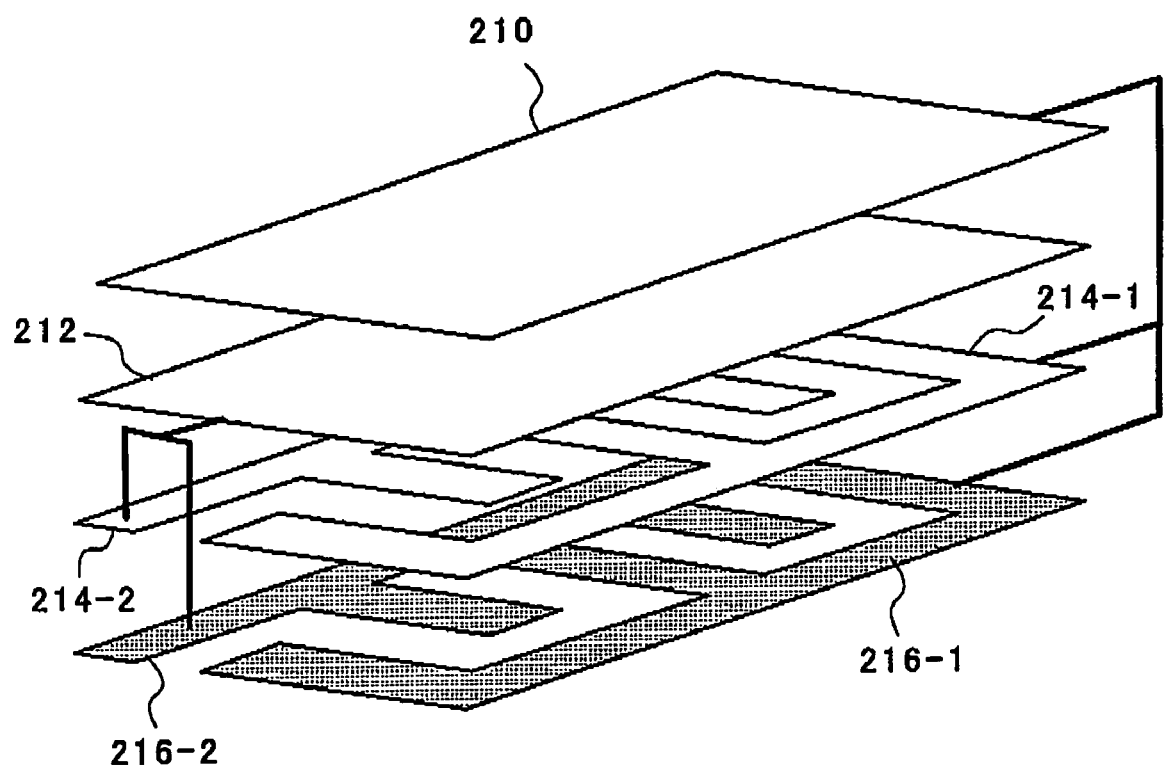
FIG. 5 is a schematic diagram illustrating a multi-layered capacitor according to a second preferred embodiment of the present invention.

FIG. 5 is a schematic diagram illustrating a multi-layered capacitor according to a second preferred embodiment of the present invention. The capacitor includes a first capacitive element (210 & 212) having a first conductor plate 210 formed on a first layer, a second conductor plate 212 formed on a second layer and an insulator arranged between the first and second conductor plates 210 and 212. The capacitor also includes a second capacitive element (214-1 & 214-2) which is arranged just below the second conductor plate 212. The capacitor further includes a third capacitive element (216-1 & 216-2) which is arranged just below the second capacitive element (214-1 & 214-2).

The first capacitive element (210 & 212) is of a MIM (Metal-Insulator-Metal) type. In other words, the first conductor plate 210 and second conductor plate 212 are made of metal.

The second capacitive element (214-1 & 214-2) is of a MOM (Metal-Oxide-Metal) type, including first and second conductor regions 214-1 and 214-2 formed on the same layer, which is just below the second conductor plate 212 of the first capacitive element. The second capacitive element (214-1 & 214-2) can be formed on a layer just above the first conductor plate 210 of the first capacitive element. The conductor regions 214-1 and 214-2 are made of metal and are insulated by an oxide region.

the third capacitive element is of a POP (Poly-Oxide-Poly) type, including a first poly-silicon region 216-1, a second poly-silicon region 216-2 and an silicon oxide region formed between the first and second poly-silicon regions 216-1 and 216-2.

The first conductor plate 210 of the first capacitive element is electrically connected to the first conductor region 214-1 of the second capacitive element and to the first poly-silicon region 216-1 of the third capacitive element. The second conductor plate 212 of the first capacitive element is electrically connected to the second conductor region 214-2 of the second capacitive element and to the second poly-silicon region 216-2 of the third capacitive element.

In the second preferred embodiment, the number of layers of the second and third capacitive elements are not limited. The third capacitive element (216-1 & 216-2) and the second capacitive element (214-1 & 214-2) may be replaced by each other.

As described above, according to the second preferred embodiment of the present invention, a multi-layered capacitor can use a space and an area in a semiconductor chip efficiently. In other words, a multi-layered capacitor can be designed small in size, which improves integration of a semiconductor chip.

Figure 6:
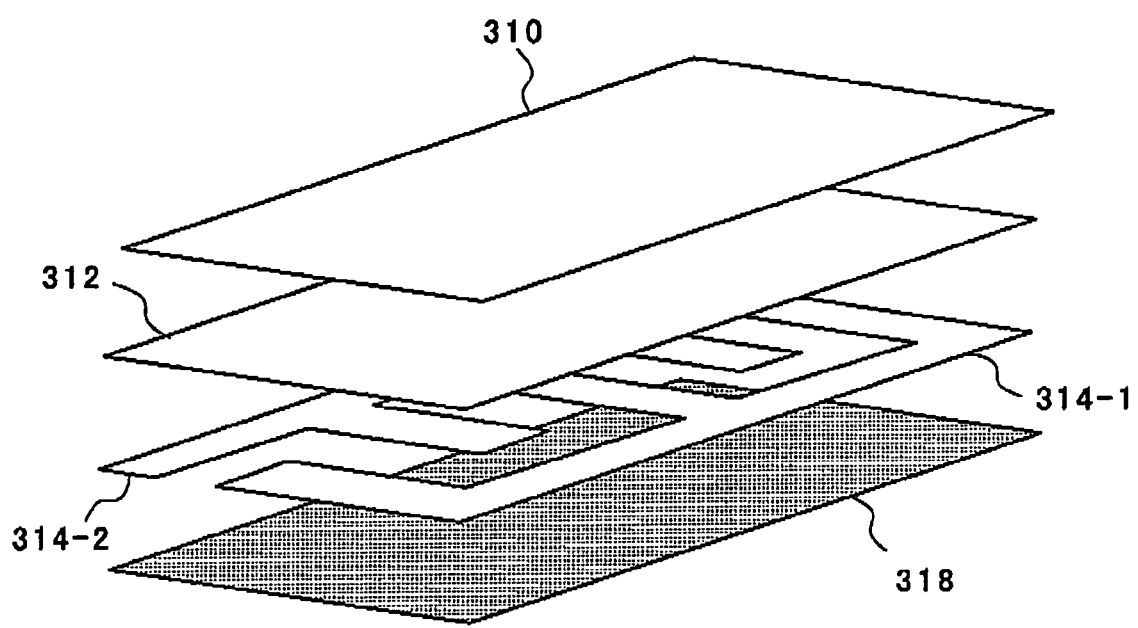
FIG. 6 is a schematic diagram illustrating a multi-layered capacitor according to a third preferred embodiment of the present invention.

FIG. 6 is a schematic diagram illustrating a multi-layered capacitor according to a third preferred embodiment of the present invention.

The capacitor includes a first capacitive element (310 & 312) having a first conductor plate 810 formed on a first layer, a second conductor plate 312 formed on a second layer and an insulator arranged between the first and second conductor plates 310 and 312. The capacitor also includes a second capacitive element (314-1 & 314-2) which is arranged just below the second conductor plate 312 of the first capacitive element. The capacitor further includes a third capacitive element 318 which is arranged just below the second capacitive element (314-1 & 314-2).

The first capacitive element (310 & 312) is of a MIM (Metal-Insulator-Metal) type. In other words, the first conductor plate 310 and second conductor plate 312 are made of metal.

The second capacitive element (314-1 & 314-2) is of a MOM (Metal-Oxide-Metal) type, including first and second conductor regions 314-1 and 314-2 formed on the same layer, which is just below the second conductor plate 312 of the first capacitive element. The second capacitive element (314-1 & 314-2) can be formed on a layer just above the first conductor plate 310 of the first capacitive element. The conductor regions 314-1 and 314-2 are made of metal and are insulated by an oxide region.

The third capacitive element 318 is of a MOS-CAP structure.

In the third preferred embodiment, the number of layers of the second and third capacitive elements are not limited. The third capacitive element 318 and the second capacitive element (314-1 & 314-2) may be replaced by each other.

As described above, according to the third preferred embodiment of the present invention, a multi-layered capacitor can use a space and an area in a semiconductor chip efficiently. In other words, a multi-layered capacitor can be designed small in size, which improves integration of a semiconductor chip.

What is claimed is:

1. A multi-layered capacitor, comprising:
   a first capacitive element having a first conductor plate formed on a first layer, a second conductor plate formed on a second layer and an insulator arranged between the first and second conductor plates; and
   a second capacitive element which is disposed on a layer immediately above or below the first capacitive element,
   wherein the second capacitive element comprises a first conductor region and a second conductor region formed on the same layer and wherein the first and second conductor regions of the second capacitive element are configured to be pectinated and engaged to each other.

2. A multi-layered capacitor, according to claim 1, wherein the first capacitive element is of a MIM (Metal-Insulator-Metal) type.

3. A multi-layered capacitor, according to claim 1, wherein the second capacitive element is of a MOM (Metal-Oxide-Metal) type, comprising first and second conductor regions formed on the same layer.

4. A multi-layered capacitor, according to claim 3, further comprising:
   a third capacitive element formed on an adjacent layer of the second capacitive element.

5. A multi-layered capacitor, according to claim 4, wherein, the third capacitive element is of a POP (Poly-Oxide-Poly) type, comprising a pair of poly-silicon regions and a silicon oxide region formed between the pair of poly-silicon regions.

6. A multi-layered capacitor, according to claim 4, wherein the third capacitive element is of a MOS-CAP (Metal Oxide Semiconductor Capacitor) structure.

7. A multi-layered capacitor, according to claim 1, wherein the second capacitive element is of a POP (Poly-Oxide-Poly) type, comprising a pair of poly-silicon regions and an silicon oxide region formed between the pair of poly-silicon regions.

8. A multi-layered capacitor, according to claim 1, wherein the second capacitive element is of a MOS-CAP (Metal Oxide Semiconductor Capacitor) structure.

9. A multi-layered capacitor, according to claim 1, wherein the second capacitive element comprises a plurality of capacitive elements formed on different layers.

* * * * *